United States Patent
Jin et al.

(10) Patent No.: US 10,910,339 B2
(45) Date of Patent: Feb. 2, 2021

(54) FLIP CHIP BONDING METHOD

(71) Applicant: SAMSUNG ELECTRONICS CO., LTD., Suwon-si (KR)

(72) Inventors: Hwail Jin, Seongnam-si (KR);
Yongwon Choi, Hwaseong-si (KR);
Myung-Sung Kang, Yongin-si (KR);
Yeongseok Kim, Hwaseong-si (KR);
Wonkeun Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/533,450

(22) Filed: Aug. 6, 2019

(65) Prior Publication Data
US 2020/0058615 A1 Feb. 20, 2020

(30) Foreign Application Priority Data
Aug. 20, 2018 (KR) .................. 10-2018-0096743

(51) Int. Cl.
*H01L 23/00* (2006.01)
*H01L 21/78* (2006.01)

(52) U.S. Cl.
CPC .............. *H01L 24/83* (2013.01); *H01L 21/78* (2013.01); *H01L 24/81* (2013.01); *H01L 24/92* (2013.01); *H01L 24/97* (2013.01); *H01L 2224/81191* (2013.01); *H01L 2224/81203* (2013.01); *H01L 2224/83091* (2013.01); *H01L 2224/83191* (2013.01); *H01L 2224/83203* (2013.01); *H01L 2224/83948* (2013.01); *H01L 2224/9211* (2013.01); *H01L 2924/20104* (2013.01); *H01L 2924/20105* (2013.01); *H01L 2924/20106* (2013.01); *H01L 2924/20107* (2013.01)

(58) Field of Classification Search
None
See application file for complete search history.

(56) References Cited

U.S. PATENT DOCUMENTS

| | | | |
|---|---|---|---|
| 6,114,239 A * | 9/2000 | Lake | ............ H01L 24/13 438/653 |
| 7,368,817 B2 | 5/2008 | Pendse | |
| 7,498,678 B2 | 3/2009 | Gonzalez et al. | |
| 7,732,255 B2 | 6/2010 | Uemura et al. | |
| 7,829,379 B2 | 11/2010 | Goida | |
| 9,117,813 B2 | 8/2015 | McConnelee et al. | |
| 9,343,423 B2 | 5/2016 | Ferger et al. | |
| 9,524,955 B2 | 12/2016 | Huang et al. | |

(Continued)

FOREIGN PATENT DOCUMENTS

| | | |
|---|---|---|
| JP | 2008135410 A | 6/2008 |
| JP | 2017197688 A | 11/2017 |

(Continued)

*Primary Examiner* — Asok K Sarkar
(74) *Attorney, Agent, or Firm* — Volentine, Whitt & Francos, PLLC

(57) ABSTRACT

A flip chip bonding method includes obtaining a die including a first substrate and an adhesive layer on the first substrate; bonding the die to a second substrate different from the first substrate; and curing the adhesive layer. The curing the adhesive layer includes heating the second substrate to melt the adhesive layer, and providing the adhesive layer and the second substrate with air having pressure greater than atmospheric pressure.

19 Claims, 9 Drawing Sheets

(56) References Cited

U.S. PATENT DOCUMENTS

| | | | |
|---|---|---|---|
| 9,831,207 B2 | 11/2017 | Wu | |
| 2008/0066856 A1* | 3/2008 | Yamazaki | ............... H01L 24/27 |
| | | | 156/285 |
| 2011/0166258 A1 | 7/2011 | Hong et al. | |
| 2013/0056686 A1 | 3/2013 | Namiki et al. | |
| 2014/0098507 A1 | 4/2014 | Kim et al. | |

FOREIGN PATENT DOCUMENTS

| | | |
|---|---|---|
| KR | 20140044561 A | 4/2014 |
| KR | 1753158 B1 | 8/2017 |
| KR | 1773711 B1 | 8/2017 |

* cited by examiner

FLIP CHIP BONDING METHOD

CROSS-REFERENCE TO RELATED APPLICATION

A claim of priority under 35 U.S.C. § 119 is made to Korean Patent Application No. 10-2018-0096743 filed on Aug. 20, 2018 in the Korean Intellectual Property Office, the entire contents of which are hereby incorporated by reference.

BACKGROUND

The inventive concepts herein relate to a method of fabricating a semiconductor device, and more particularly to a flip chip bonding method.

In semiconductor packages used in electronic products, the current trend is toward small sizes and thicknesses. Accordingly, there is interest in methods of interconnecting semiconductor chips to package substrates through flip-chip bonding so as to provide semiconductor packages having high density and high capacity, and which may be assembled with high speed while minimizing mounting area and thickness of the semiconductor packages.

SUMMARY

Embodiments of the inventive concepts provide a flip chip bonding method capable of reducing defects such as voids and fillets.

Embodiments of the inventive concepts provide a flip chip bonding method including obtaining a die that includes a first substrate and an adhesive layer on the first substrate; bonding the die to a second substrate different from the first substrate; and curing the adhesive layer. The curing the adhesive layer includes heating the second substrate to melt the adhesive layer, and providing the adhesive layer and the second substrate with air having pressure greater than atmospheric pressure.

Embodiments of the inventive concepts further provide a flip chip bonding method including obtaining a plurality of dies that each include a first substrate and an adhesive layer on the first substrate; providing the plurality of dies onto a second substrate; heating the plurality of dies and the adhesive layer to a first temperature to melt bumps of the plurality of dies and the adhesive layer; compressing the plurality of dies against the second substrate; determining whether a number of the plurality of dies bonded to the second substrate responsive to the compressing is greater than a reference number; heating the second substrate to a second temperature to re-melt the adhesive layer upon determination that the number of the plurality of dies bonded to the second substrate is greater than the reference number, the second temperature being less than the first temperature; and removing a void from the adhesive layer by providing the adhesive layer and the second substrate with air having pressure equal to or greater than atmospheric pressure.

Embodiments of the inventive concepts still further provide a flip chip bonding method including placing a die on a second substrate, the die including a first substrate with metallic bumps and an adhesive layer on the substrate; heating the die to a first temperature; compressing the die against the second substrate after the heating to bond the die to the second substrate; heating the second substrate to a second temperature in an oven after the compressing to melt the adhesive layer; and removing voids in the melted adhesive layer by increasing air pressure in the oven to greater than atmospheric pressure.

BRIEF DESCRIPTION OF THE DRAWINGS

The foregoing and other features of the inventive concepts will be described hereinafter in detail with reference to the accompanying drawings in which like reference numerals refer to like parts or steps throughout the different views.

DETAILED DESCRIPTION OF EMBODIMENTS

Figure 1:
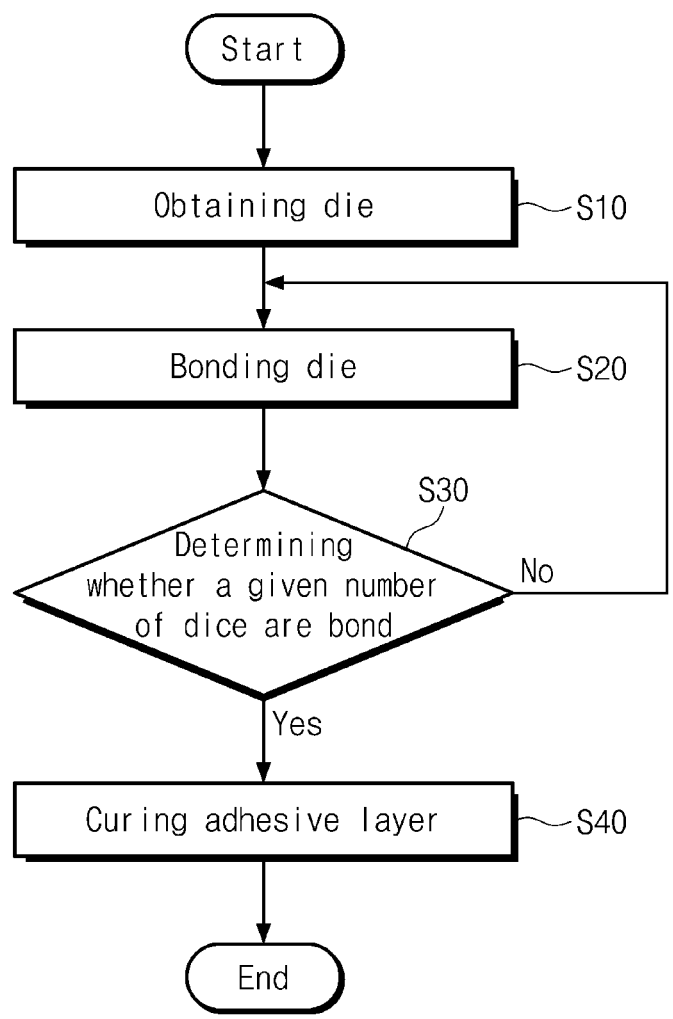
FIG. 1 illustrates a flow chart of a flip chip bonding method according to example embodiments of the inventive concepts.

Example embodiments will be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the inventive concepts to those of ordinary skill in the art. In the drawings, the thicknesses of layers and regions may be exaggerated for clarity. Like reference characters and/or numerals in the drawings denote like elements, and thus their description may be omitted.

FIG. 1 illustrates a flow chart of a flip chip bonding method according to example embodiments of the inventive concepts. FIGS. 2, 3, 4, 5, 6, 7, 8, 9 and 10 illustrate cross-sectional views descriptive of the flip chip bonding method of FIG. 1.

Referring to FIGS. 1 to 10, a flip chip bonding method according to embodiments of the inventive concepts includes step S10 of obtaining a die 40, step S20 of bonding the die 40, step S30 of determining whether or not a given number of dice (i.e., dies) 40 are bonded, and step S40 of curing an adhesive layer 30. Hereinafter, die 40 may refer both to a singular die or a plurality of dice. At step S10, the die 40 may be prepared from a first substrate 10. At step S20, the adhesive layer 30 may be used to attach the die 40 to a second substrate 50 (i.e., bonding the die 40 to the second substrate 50 different than the first substrate 10). At step S30, determination of whether a given number of the dice 40 are bonded to the second substrate 50 is made. At step S40, defects may be removed from the adhesive layer 30.

Figure 11:
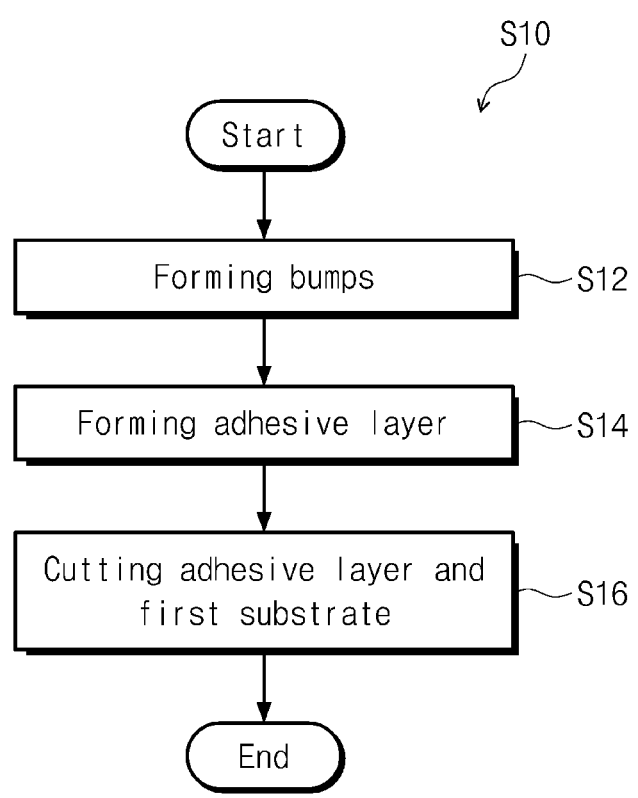
FIG. 11 illustrates a flow chart of a step of obtaining a die in the flow chart of FIG. 1.

FIG. 11 illustrates an example of step S10 of obtaining the die 40, as shown in the flow chart of FIG. 1.

Referring to FIGS. 2 to 4 and 11, step S10 of obtaining the die 40 may include step S12 of forming bumps 20, step S14 of forming the adhesive layer 30, and step S16 of cutting the adhesive layer 30 and the first substrate 10.

Figure 2:
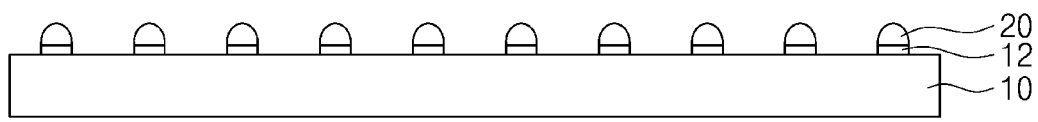
FIGS. 2, 3, 4, 5, 6, 7, 8, 9, and 10 illustrate cross-sectional views descriptive of the flip chip bonding method of FIG. 1.

Referring to FIGS. 2 and 11, a ball attaching apparatus (not shown) may form the bumps 20 on or over the first substrate 10 (S12). The first substrate 10 may include a silicon wafer for example. The first substrate 10 may have a plurality of first pads 12 on or over a main upper surface. The first pads 12 may be conductive. The bumps 20 may be formed on the first pads 12. Each of the bumps 20 may include a solder ball. Each of the bumps 20 may be metallic.

Figure 3:
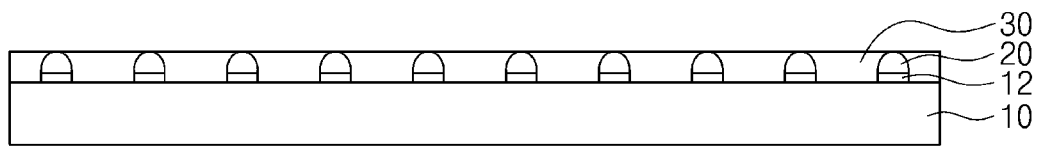

Referring to FIGS. 3 and 11, an adhesive coating apparatus (not shown) may form the adhesive layer 30 on or over the first substrate 10 and the bumps 20 (S14). The adhesive layer 30 may be coated on an entirety of a top surface of the first substrate 10. The adhesive layer 30 may include a non-conductive film (NCF) or a non-conductive paste (NCP). For example, the adhesive layer 30 may contain a thermosetting resin, a hardener, and a reducer. The thermosetting resin may include for example a bisphenol A epoxy resin, a bisphenol F epoxy resin, a novolac epoxy resin, an aliphatic epoxy resin, or a glycidylamine epoxy resin, or the like. The hardener may cure the thermosetting resin. The hardener may include for example amine or polyimide. The thermosetting resin and the hardener may have for example an equivalence ratio of caloric value per unit mass of about 100 joule/gram (J/g) to about 150 J/g. The thermosetting resin and the hardener may have for example a mixture ratio of about 10:1 to about 15:1. The reducer may react at a temperature of about 100° C. to 150° C. or higher to remove native oxide from the first pads 12 and the bumps 20. For example, the reducer may include in its one molecule one or more alcoholic hydroxyl groups (e.g., dimethanol, diethylen glycol, butanetriol, or triethanolamine), one or more phenolic hydroxyl groups (e.g., naphthol, hydroxyhydroquinone, or trihydroxybenzopyenone), one or more carboxylic acids (e.g., oxalic acid, succinic acid, malonic acid, oxoacid, or carboxylic acid derivative), a nitrogen-containing compound having an unshared electron pair (e.g., imidazole or amine), or a combination thereof.

The adhesive layer 30 may further contain for example a flux of carboxylic hydrate, hydroxyl hydrate, or phenolic hydrate, or the like. The reducer may react at about 150° C. with the native oxide.

Figure 4:
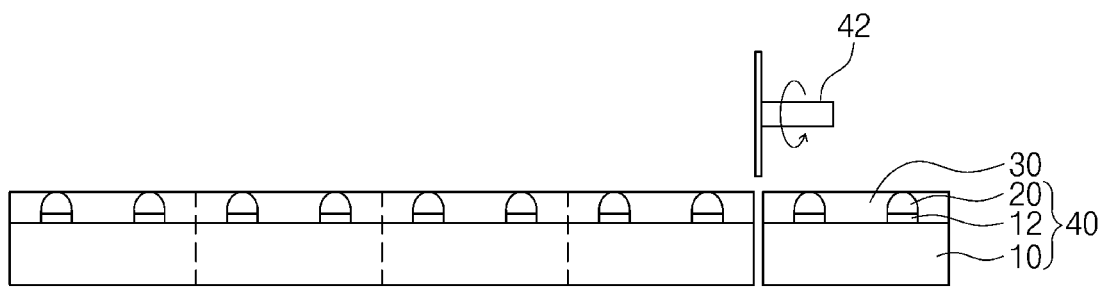

Referring to FIGS. 4 and 11, a cutting apparatus 42 may cut the adhesive layer 30 and the first substrate 10 into a plurality of the dice 40 (S16). The cutting apparatus 42 may be for example a wafer sawing machine or a laser sawing machine. The die 40 may include for example a memory chip, a logic chip, or an application processor (AP), among other components. The die 40 may have a rectangular shape when viewed in plan.

Figure 12:
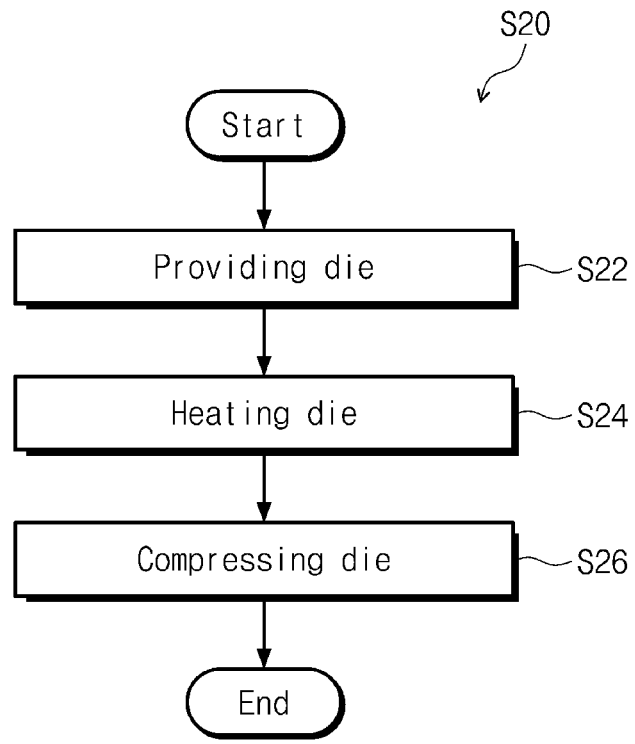
FIG. 12 illustrates a flow chart of a step of bonding a die in the flow chart of FIG. 1.

FIG. 12 illustrates an example of step S20 of bonding the die 40, as shown in the flow chart of FIG. 1.

Referring to FIGS. 5 to 7 and 12, at step S20, a thermocompression process may be performed on the die 40 and the adhesive layer 30. For example, the step S20 of bonding the die 40 may include step S22 of providing the die 40, step S24 of heating the die 40, and step S26 of compressing the die 40.

Figure 5:
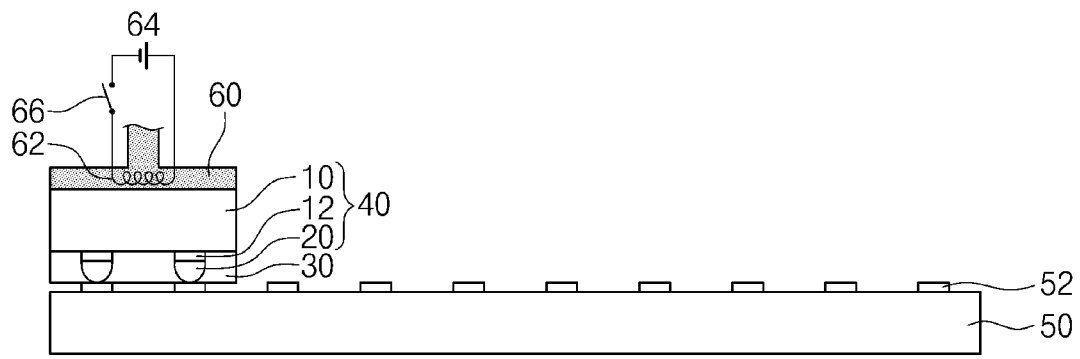

Referring to FIGS. 5 and 12, a bonding head 60 may provide (i.e., place) the die 40 onto a second substrate 50 (S22). The second substrate 50 may have a plurality of second pads 52 on an upper main surface. The second pads 52 may be conductive. The bumps 20 may be aligned with the second pads 52. The first pads 12 may also be aligned with the second pads 52. The bonding head 60 may align the first pads 12 with the second pads 52 in about 0.5 seconds or less. The bonding head 60 may have a first heater 62. The first heater 62 may be connected in series with a first power source 64 and a first switch 66. The first power source 64 may supply the first heater 62 with first heating power. The first switch 66 may control the first heating power.

Figure 6:
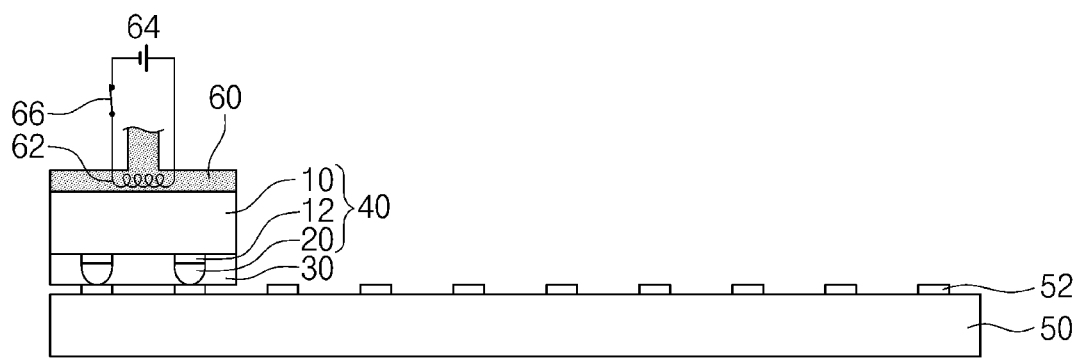

Referring to FIGS. 6 and 12, when the first switch 66 is closed, the first heater 62 as powered by the first heating power may heat the die 40 and melt the bumps 20 of the die 40 and the adhesive layer 30 (S24). The first heater 62 may for example heat the die 40 to a temperature (i.e., a first temperature) of about 150° C. to about 300° C.

Figure 7:
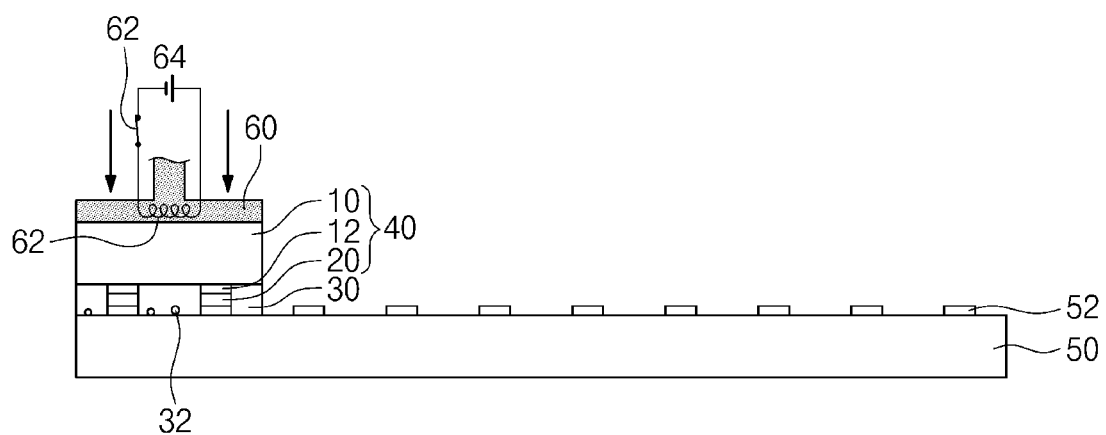

Referring to FIGS. 7 and 12, as expressed by arrows, the bonding head 60 may compress the die 40 against the second substrate 50 (S26). The bumps 20 may connect the first pads 12 to the second pads 52. The bonding head 60 may bond the die 40 to the substrate 50 at high speed. For example, the bonding head 60 may compress the die 40 against the substrate 50 for about 3 seconds to about 4 seconds to bond the die 40 to the substrate 50. However, if the die 40 is promptly compressed for the specified time or duration to be bonded as described above, a curing reaction between the thermosetting resin and the hardener of the adhesive layer 30 may be weak or incomplete. Furthermore, the prompt bonding of the die 40 as described may generate a large number of voids 32 in the adhesive layer 30. The voids 32 may be defects of the adhesive layer 30. The voids 32 may be generated close to a top surface of the second substrate 50, and may occupy about 4% of the total volume of the adhesive layer 30.

When the first switch 66 is subsequently opened, the bumps 20 and the adhesive layer 30 may be cooled down. The bumps 20 and the adhesive layer 30 may then be solidified.

As an alternative, the adhesive layer 30 may be formed on the second substrate 50, and the die 40 may thereafter be provided onto the adhesive layer 30. However, in such a case the adhesive layer 30 may pollute side and bottom surfaces of the second substrate 50, and also alignment fault of the die 40 may occur. In contrast, when the adhesive layer 30 is formed on the die 40, and the die 40 with the adhesive layer 30 thereon is thereafter bonded to the second substrate 50, it may be possible to prevent alignment fault of the die 40.

Figure 8:
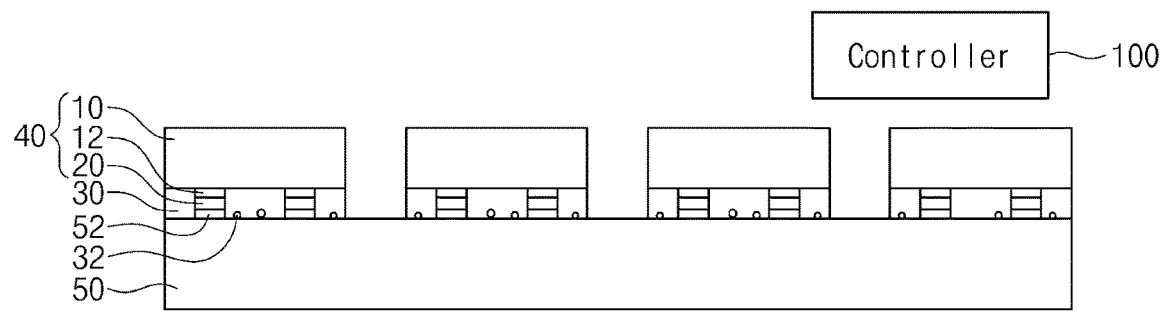

Referring to FIGS. 1 and 8, at step S30, a controller 100 may determine whether or not a given number of the dice 40 are bonded to the second substrate 50. The controller 100 may for example perform well known testing and/or inspection of the dice 40 to determine if the dice 40 are successfully bonded to the second substrate 50. For example, the controller 100 may determine whether a number of the dice 40 that are successfully bonded to the second substrate 50 in step S20 is greater than a reference number. In case that the given number of the dice 40 are not bonded to the second substrate 50, or in other words the number of dice 40 that are successfully bonded to the second substrate 50 is not greater than the reference number (No in S30), the flip chip method may return to step S20 and the bonding head 60 may additionally and/or repeatedly perform bonding of at least one die 40 to the second substrate 50 (S20). As a result, a given number of the dice 40 may be bonded to the second substrate 50, or in other words the number of dice 40 that are successfully bonded to the second substrate 50 is greater than the reference number (Yes in S30), and the flip chip bonding method may proceed to step S40.

In the case that the second substrate 50 is a printed circuit board, about two hundred to about five hundred dice 40 may be bonded to the second substrate 50, and the duration of the bonding (S20) of the dice 40 may be for example about 6 minutes to about 25 minutes. In the case that the second substrate 50 is a silicon wafer, about one thousand dice 40 may be bonded to the second substrate 50 and the duration of the bonding (S20) of the dice 40 may be for example about 50 minutes to about 1 hour.

Figure 13:
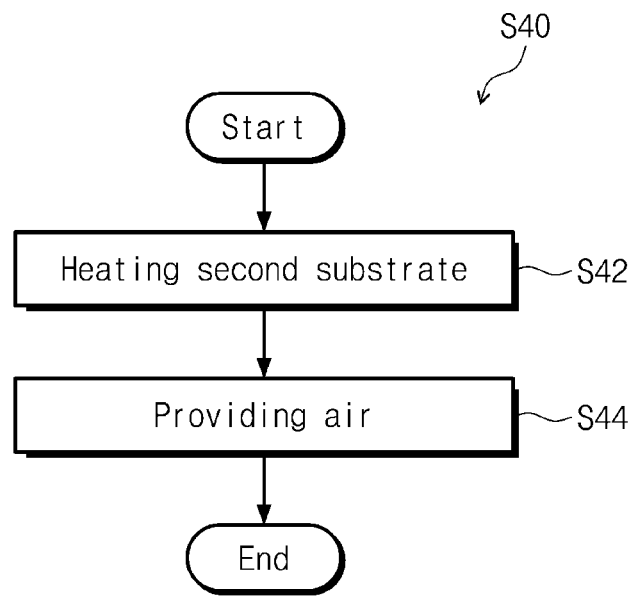
FIG. 13 illustrates a flow chart of a step of curing an adhesive layer in the flow chart of FIG. 1.

FIG. 13 illustrates an example of the step S40 of curing the adhesive layer 30, as shown in the flow chart of FIG. 1.

Figure 9:
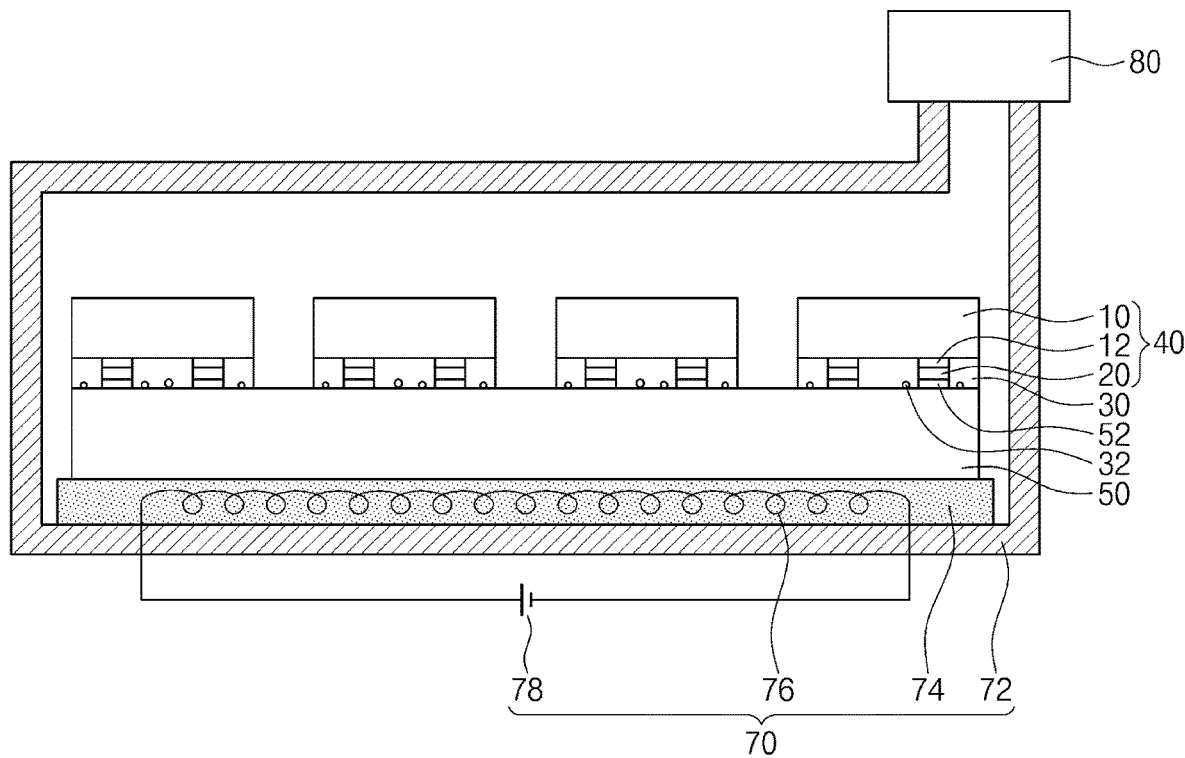
Figure 10:
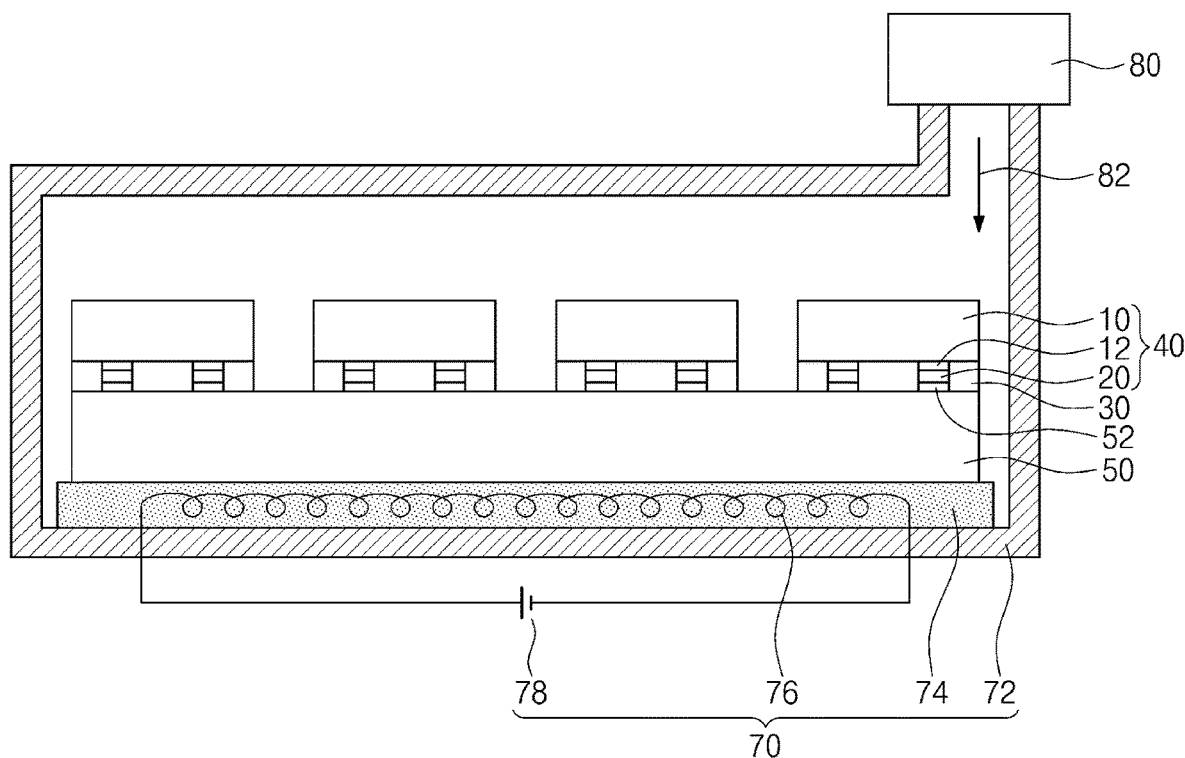

Referring to FIGS. 9, 10, and 13, a reflow process may be performed on the adhesive layer 30 at step S40 of curing the adhesive layer 30. For example, the adhesive layer 30 may be successfully cured for about 10 minutes to about 60 minutes. Step S40 of curing the adhesive layer 30 may include step S42 of heating the second substrate 50 and step S44 of providing air 82.

Referring to FIGS. 9 and 13, when a given number of the dice 40 are bonded to the second substrate 50, or in other words the number of the dice 40 that are successfully bonded to the second substrate 50 is greater than the reference number (Yes in S30 of FIG. 1), the second substrate 50 may be heated in an oven 70 (S42). In the oven 70, the second substrate 50 may be heated to re-melt the adhesive layer 30 and/or the bumps 20. For example, the oven 70 may include housing 72, a plate 74, second heater 76, and second power source 78. The housing 72 in which the second substrate 50 is placed may provide a hermetically sealed space. The plate 74 may reside or be disposed on a floor side of the housing 72. The second substrate 50 may be loaded or held on the plate 74. The second heater 76 may be installed or disposed in the plate 74. When the second power source 78 supplies the second heater 76 with second heating power, the second heater 76 may heat the second substrate 50. The second heater 76 may heat the second substrate 50 to a temperature (i.e., a second temperature) of for example about 100° C. to about 150° C. The second temperature may be less than the first temperature. When the second substrate 50 is heated to a temperature of about 100° C. to about 150° C., the adhesive layer 30 and/or the bumps 20 may be melted, and the melted adhesive layer 30 may have a viscosity of about 2,000 pascal-second (Pa·s) to about 3,000 Pa·s. Alternatively, the second substrate 50 may be heated to a temperature of about 50° C. to about 200° C. to melt the adhesive layer 30, and the melted adhesive layer 30 may have a viscosity of about 500 Pa·s to about 4,000 Pa·s. The housing 72 may be engaged with an air supply 80.

Referring to FIGS. 10 and 13, the air supply 80 may provide air 82 (e.g., see FIG. 15) to the adhesive layer 30 and the second substrate 50 in the housing 72, removing the voids 32 from the adhesive layer 30 (S44). The air 82 may include for example a nitrogen gas, a helium gas, an oxygen gas, a carbon dioxide gas, or an argon gas, or a combination thereof. The air supply 80 may include an air pump. When the air supply 80 provides the air 82 into the housing 72, the air 82 in the housing 72 may increase in pressure. When the pressure of the air 82 in the housing 72 is increased, the adhesive layer 30 may increase in cohesive force and/or surface tension. When the cohesive force and/or the surface tension of the adhesive layer 30 are increased, the voids 32 may be discharged and removed out of the adhesive layer 30.

Figure 14:
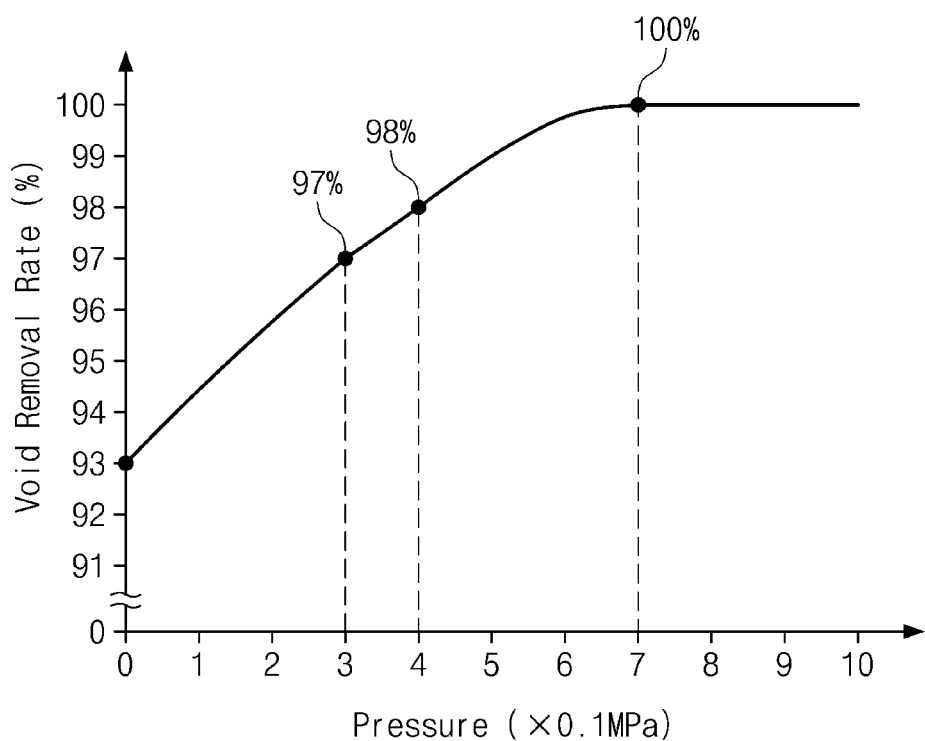
FIG. 14 illustrates a graph showing how a void removal rate depends on air pressure in a housing shown in FIG. 9.

FIG. 14 illustrates a graph showing how a removal rate of the voids 32 depends on the pressure of the air 82 in the housing 72. The horizontal axis shows air pressure in megapascals, and the vertical axis shows void removal rate.

Referring to FIG. 14, when the pressure of the air 82 in the housing 72 is equal to or greater than about 3 bars (or 0.3 Mpa), the removal rate of the voids 32 may be equal to or greater than about 97%. When the pressure of the air 82 in the housing 72 is about 7 bars (or 0.7 Mpa) to about 10 bars (or 1.0 Mpa), the removal rate of the voids 32 may be almost about 100%. When the pressure of the air 82 in the housing 72 is equal to or greater than about 4 bars (or 0.4 Mpa), the removal rate of the voids 32 may be almost about 98%. When the pressure of the air 82 in the housing 72 is about 1 bar (or 0.1 Mpa) to about 2 bars (or 0.2 Mpa), the removal rate of the voids 32 may be equal to or less than about 95%.

Figure 15:
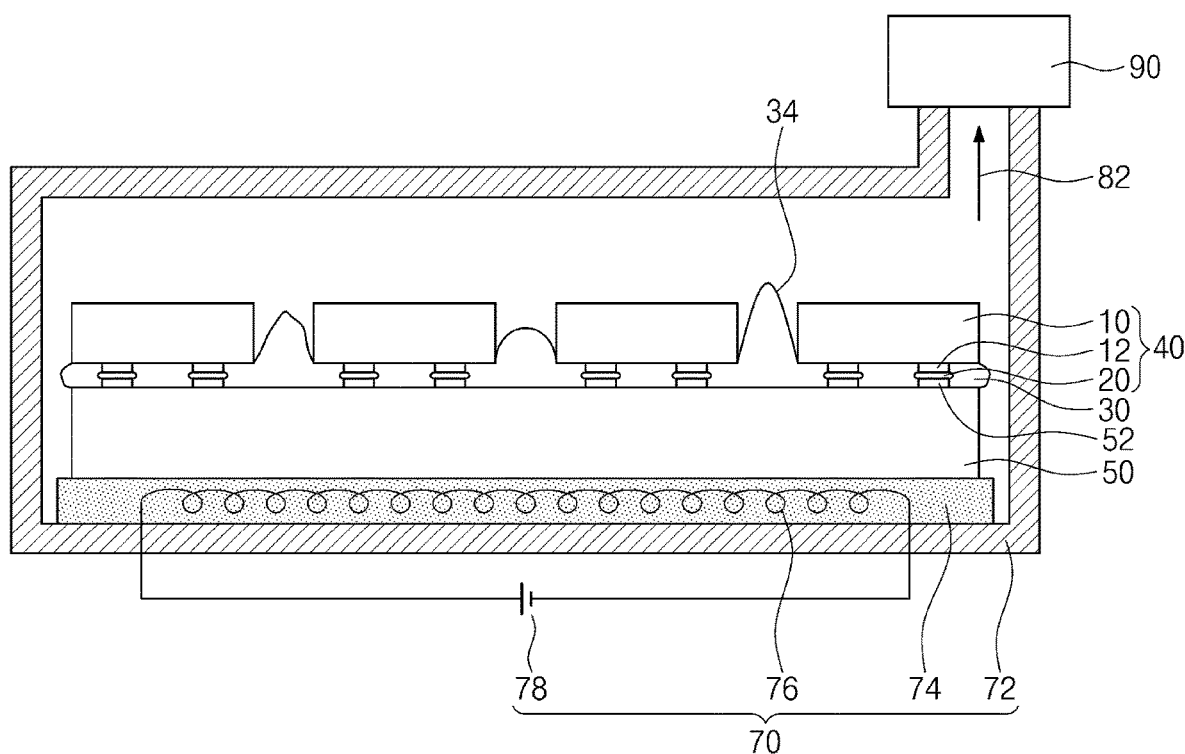
FIG. 15 illustrates a cross-sectional view of a fillet of an adhesive layer under typical vacuum pressure.

FIG. 15 illustrates a cross-sectional view of a fillet 34 of the adhesive layer 30 under typical vacuum pressure.

Referring to FIG. 15, when the pressure of the air 82 in the housing 72 is reduced to vacuum pressure, the voids 32 may be promptly removed or decreased in the adhesive layer 30. The housing 72 may be engaged with an air exhaust 90 to evacuate or pump the air 82 from or out of the housing 72. The air exhaust 90 may include an air pump. The pressure of the air 82 in the housing 72 may be reduced to vacuum pressure. However, when the pressure of the air 82 is reduced to vacuum pressure, a fillet 34 of the adhesive layer 30 may be generated and/or increased. The fillet 34 is a type of defect formed when a portion of the adhesive layer 30 outwardly protrudes to the outside of the dice 40. In other words, the fillet 34 of the adhesive layer 30 protrudes above an upper main surface of the dice 40.

It may be desired to dispose a package on the dice 40. When the fillet 34 is higher or thicker than the dice 40, or in other words when the fillet 34 protrudes above an upper main surface of the dice 40, packages may stack poorly on the dice 40.

Referring back to FIGS. 9 and 10, the air supply 80 may provide the air 82 within the housing 72 as having pressure equal to or greater than atmospheric pressure or 1 bar. Thus, defects such as the voids 32 and the fillet 34 may be reduced or removed from the adhesive layer 30.

In the flip chip bonding method according to the inventive concepts, air having pressure greater than atmospheric pressure may be provided to an adhesive layer between a substrate and a die, which may result in a reduction in defects such as voids and fillets of the adhesive layer.

Although the inventive concepts have been described with reference to the accompanying drawings, it should be understood to those skilled in the art that various changes and modifications may be made without departing from the technical spirit and features of the inventive concepts. It should therefore be understood that the embodiments described above are illustrative but not limiting.

What is claimed is:

1. A flip chip bonding method comprising:
    obtaining a die that includes a first substrate having a plurality of bumps and an adhesive layer on the first substrate;
    providing the die onto a second substrate;
    heating the die to a first temperature to melt the plurality of bumps and the adhesive layer;
    compressing the die against the second substrate to bond the die to the second substrate; and
    curing the adhesive layer,
    wherein the curing the adhesive layer comprises
        heating the second substrate to a second temperature lower than the first temperature to re-melt the adhesive layer, and
        providing the adhesive layer and the second substrate with air having pressure greater than atmospheric pressure to remove a void in the adhesive layer.

2. The method of claim 1, wherein the air is provided at a pressure equal to or greater than 3 bars.

3. The method of claim 1, wherein the adhesive layer comprises:
    an epoxy resin; and
    a hardener that cures the epoxy resin, wherein the epoxy resin and the hardener have an equivalence ratio of caloric value per unit mass of 100 joule/gram (J/g) to 150 J/g.

4. The method of claim 3, wherein the adhesive layer further comprises a reducer.

5. The method of claim 4, wherein the reducer comprises one or more of an alcoholic hydroxyl group, a phenolic hydroxyl group, a carboxylic acid, and a nitrogen-containing compound, wherein
the alcoholic hydroxyl group includes dimethanol, diethylen glycol, butanetriol, or triethanolamine,
the phenolic hydroxyl group includes naphthol, hydroxyhydroquinone, or trihydroxybenzopyenone,
the carboxylic acid includes oxalic acid, succinic acid, malonic acid, oxoacid, or carboxylic acid derivative, and
the nitrogen-containing compound includes imidazole or amide.

6. The method of claim 1, wherein the heating the second substrate comprises heating the second substrate to 50° C. to 200° C. so that the adhesive layer has a viscosity of 500 Pa·s to 4,000 Pa·s.

7. The method of claim 1, wherein the curing the adhesive layer comprises performing a reflow process.

8. The method of claim 1, wherein the compressing the die comprises performing a thermocompression process.

9. The method of claim 1, wherein the heating the die comprises heating the die to 150° C. to 300° C.

10. A flip chip bonding method comprising:
obtaining a plurality of dies that each include a first substrate and an adhesive layer on the first substrate;
providing the plurality of dies onto a second substrate;
heating the plurality of dies and the adhesive layer to a first temperature to melt bumps of the plurality of dies and the adhesive layer;
compressing the plurality of dies against the second substrate;
determining whether a number of the plurality of dies bonded to the second substrate responsive to the compressing is greater than a reference number;
heating the second substrate to a second temperature to re-melt the adhesive layer upon determination that the number of the plurality of dies bonded to the second substrate is greater than the reference number, the second temperature being less than the first temperature; and
removing a void from the adhesive layer by providing the adhesive layer and the second substrate with air having pressure equal to or greater than atmospheric pressure.

11. The method of claim 10, wherein the first temperature is 150° C. to 300° C., and the second temperature is 100° C. to 150° C.

12. The method of claim 10, wherein the second substrate is heated in an oven, and the air is provided by an air supply engaged with the oven.

13. The method of claim 12, wherein the oven comprises:
a housing;
a plate disposed in the housing and configured to hold the second substrate; and
a heater disposed in the plate and configured to heat the second substrate.

14. The method of claim 10, wherein the obtaining the plurality of dies comprises:
forming the bumps on a plurality of first pads of a substrate;
forming an adhesive on the bumps and the substrate; and
cutting the adhesive and the substrate to provide the plurality of dies each including the cut adhesive and the cut substrate respectively as the first substrate and the adhesive layer.

15. The method of claim 10, wherein the air is provided at a pressure equal to or greater than 3 bars.

16. The method of claim 10, wherein the adhesive layer comprises:
an epoxy resin; and
a hardener that cures the epoxy resin,
wherein the epoxy resin and the hardener have a mixture ratio of 10:1 to 15:1.

17. A flip chip bonding method comprising;
placing a die on a second substrate, the die including a first substrate with metallic bumps and an adhesive layer on the first substrate;
heating the die to a first temperature to melt the metallic bumps and the adhesive layer;
compressing the die against the second substrate after the heating to bond the die to the second substrate;
heating the second substrate to a second temperature lower than the first temperature in an oven after the compressing to re-melt the adhesive layer; and
removing voids in the re-melted adhesive layer by increasing air pressure in the oven to greater than atmospheric pressure.

18. The method of claim 17, wherein the first temperature is 150° C. to 300° C., and the second temperature is 100° C. to 150° C.

19. The method of claim 17, wherein the removing the voids comprises increasing the air pressure to 3 bars or greater.

* * * * *